United States Patent
Ono

(10) Patent No.: US 12,078,923 B2
(45) Date of Patent: Sep. 3, 2024

(54) PELLICLE, EXPOSURE ORIGINAL PLATE, EXPOSURE APPARATUS, METHOD OF MANUFACTURING PELLICLE, AND METHOD OF MANUFACTURING SEMICONDUCTOR DEVICE

(71) Applicant: MITSUI CHEMICALS, INC., Tokyo (JP)

(72) Inventor: Yousuke Ono, Sodegaura (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 18/002,692

(22) PCT Filed: Aug. 3, 2021

(86) PCT No.: PCT/JP2021/028798
§ 371 (c)(1),
(2) Date: Dec. 21, 2022

(87) PCT Pub. No.: WO2022/030498
PCT Pub. Date: Feb. 10, 2022

(65) Prior Publication Data
US 2023/0341763 A1   Oct. 26, 2023

(30) Foreign Application Priority Data

Aug. 5, 2020   (JP) ................... 2020-133262

(51) Int. Cl.
*G03F 1/64*   (2012.01)
*G03F 7/00*   (2006.01)

(52) U.S. Cl.
CPC ............ *G03F 1/64* (2013.01); *G03F 7/70033* (2013.01)

(58) Field of Classification Search
CPC .......... G03F 1/64; G03F 7/70033; G03F 1/62; G03F 7/70983
See application file for complete search history.

(56) References Cited

U.S. PATENT DOCUMENTS

| 2014/0307237 | A1 | 10/2014 | Sekihara | |
| 2017/0285461 | A1* | 10/2017 | Okubo | ................ G03F 7/2004 |
| 2018/0149966 | A1* | 5/2018 | Shin | ................ H01L 21/02595 |

(Continued)

FOREIGN PATENT DOCUMENTS

| JP | H2-168613 A | 6/1990 |
| JP | H11167198 A | 6/1999 |

(Continued)

*Primary Examiner* — Stewart A Fraser
(74) *Attorney, Agent, or Firm* — BUCHANAN, INGERSOLL & ROONEY PC

(57) ABSTRACT

Disclosed is a pellicle including a pellicle membrane including a carbon-based membrane having a carbon content of 40% by mass or more and a support frame that supports the pellicle membrane, in which the pellicle membrane and the support frame are in contact with each other, and at least one of the following conditions 1 and 2 is satisfied. [Condition 1] In the support frame, a surface in contact with the pellicle membrane has a roughness Ra of 1.0 μm or less. [Condition 2] The support frame has a width of unevenness of 10 μm or less at an edge portion on a surface side in contact with the pellicle membrane and on an inner side of the pellicle.

10 Claims, 12 Drawing Sheets

(56) References Cited

U.S. PATENT DOCUMENTS

2019/0121229 A1\* 4/2019 Okubo ..................... G03F 7/20
2019/0129300 A1 5/2019 Ono et al.

FOREIGN PATENT DOCUMENTS

| JP | 2006184704 A | 7/2006 |
|----|--------------|--------|
| JP | 2012159671 A | 8/2012 |
| JP | 2017-076024 A | 4/2017 |
| JP | 2019168502 A | 10/2019 |
| JP | 2019174628 A | 10/2019 |
| KR | 10-2014-0123891 A | 10/2014 |
| KR | 10-2019-0003752 A | 1/2019 |

\* cited by examiner

OBSERVATION SITE

PELLICLE, EXPOSURE ORIGINAL PLATE, EXPOSURE APPARATUS, METHOD OF MANUFACTURING PELLICLE, AND METHOD OF MANUFACTURING SEMICONDUCTOR DEVICE

TECHNICAL FIELD

The present disclosure relates to a pellicle, an exposure original plate, an exposure apparatus, a method of manufacturing a pellicle, and a method of manufacturing a semiconductor device.

BACKGROUND ART

In a technique (photolithography) in which a photosensitive substance is applied to a surface of an object such as an electronic component, a printed circuit board, or a display panel and exposed in a pattern shape to form a pattern, a transparent substrate called a photomask in which a pattern is formed on one surface is used.

In recent years, with advancement of high definition of an exposure pattern, use of EUV (Extreme Ultra Violet) light having a shorter wavelength has been expanded as a light source for exposure instead of DUV (Deep Ultra Violet) light. In an exposure method using EUV light, a photomask including a reflection layer that reflects exposure light is sometimes used.

For example, Patent Document 1 discloses a pellicle for lithography in which a surface roughness of an inside surface of a pellicle frame is in a range of Ra 0.3 to 0.9 μm, Rt 4.0 to 8.5 μm, and RMS 0.3 to 1.1 μm, and the frame inside surface is coated with an adhesive resin.

For example, Patent Document 2 discloses a large pellicle for liquid crystal having a pellicle area of 1000 $cm^2$ or more, in which the surface roughness of a pellicle membrane adhesion surface of a frame is Ra 0.4 μm to 4 μm, and a pellicle membrane is attached via an adhesive.

For example, Patent Document 3 discloses that blasting treatment is performed to facilitate detection when dust or the like adheres to a frame body of a pellicle.

Patent Document 1: Japanese Patent Application Laid-Open (JP-A) No. 11-167198
Patent Document 2: Japanese Patent Application Laid-Open (JP-A) No. 2006-184704
Patent Document 3: Japanese Patent Application Laid-Open (JP-A) No. 2012-159671

SUMMARY OF INVENTION

Technical Problem

In photolithography, exposure with EUV (Extreme Ultra Violet) light is performed in a vacuum environment.

When exposure is started, an entire exposure apparatus is evacuated, the pellicle and the photomask are arranged in a load lock chamber connected to an inside of the exposure apparatus, and the inside of the load lock chamber changes from an atmospheric pressure environment to the vacuum environment.

When the load lock chamber is evacuated, an air pressure reduction rate outside the pellicle tends to be higher than the air pressure reduction rate inside the pellicle. Thus, as shown in FIG. 1, a pellicle membrane 12 supported by a support frame 14 bulges in a direction from an inside of a pellicle 10 toward an outside of the pellicle 10 by evacuating the exposure apparatus.

On the other hand, when exposure is finished, the pellicle is transported from the inside of the exposure apparatus to the load lock chamber, and the inside of the load lock chamber changes from the vacuum environment to the atmospheric pressure environment. Thus, as shown in FIG. 2, when exposure is finished, the pellicle membrane 12 supported by the support frame 14 is pushed in a direction from the outside of the pellicle 10 toward the inside of the pellicle 10.

Here, as shown in FIGS. 3A and 3B, there is a problem that stress concentration is likely to occur at an edge portion on a pellicle inner side of the support frame in a contact surface between the support frame and the pellicle membrane, and the pellicle membrane is likely to be damaged.

In addition, as described in Patent Document 3, when the blasting treatment is applied to the pellicle to facilitate detection of a foreign substance, it is considered that the above problem becomes more apparent.

The membrane bulges as shown in FIGS. 1 and 2 even when the pellicle membrane receives a pressure by an air flow at the time of handling the photomask to which the pellicle is attached, without being limited to evacuation inside the exposure apparatus and atmospheric pressure opening.

An object to be solved by one embodiment of the present disclosure is to provide a pellicle, an exposure original plate, and an exposure apparatus capable of suppressing damage of a pellicle membrane.

An object to be solved by another embodiment of the present disclosure is to provide a method of manufacturing a pellicle and a method of manufacturing a semiconductor device capable of suppressing damage of a pellicle membrane.

Solution to Problem

Specific means for achieving the object includes the following aspects.

<1> A pellicle including: a pellicle membrane including at least one selected from the group consisting of a carbon-based membrane having a carbon content of 40% by mass or more, polysilicon, and silicon carbide; and a support frame that supports the pellicle membrane, wherein the pellicle membrane and the support frame are in contact with each other, and at least one of the following condition 1 or condition 2 is satisfied:
condition 1: in the support frame, a surface in contact with the pellicle membrane has a roughness Ra of 1.0 μm or less; and
condition 2: the support frame has a width of unevenness of 10 μm or less at an edge portion at a surface side in contact with the pellicle membrane and at an inner side of the pellicle.
<2> The pellicle according to <1>, wherein the pellicle membrane includes a carbon-based membrane having a carbon content of 40% by mass or more.
<3> The pellicle according to <1> or <2>, wherein the carbon-based membrane is a membrane containing a carbon nanotube.
<4> The pellicle according to any one of <1> to <3>, wherein both condition 1 and condition 2 are satisfied.
The above <4> may be paraphrased as the following <4-1>.
<4-1> The pellicle according to any one of <1> to <3>, further including: a pellicle membrane containing a carbon nanotube; and a support frame that supports the pellicle membrane, wherein the pellicle membrane and the support frame are in contact with each other, a surface of the support frame, which is in contact with the pellicle membrane, has a roughness Ra of 1.0 μm or less, and the support frame has a width of unevenness of 10 μm or less at an edge on a side of the surface in contact with the pellicle membrane and on an inner side of the pellicle.

<5> The pellicle according to any one of <1> to <4>, wherein the support frame includes a first support frame that supports the pellicle membrane and a second support frame connected to the first support frame.

<6> An original plate for exposure including: an original plate having a pattern; and the pellicle according to any one of <1> to <5> mounted on a surface of the original plate on a side having the pattern.

<7> An exposure apparatus including the original plate for exposure according to <6>.

<8> An exposure apparatus including: a light source that emits exposure light; the original plate for exposure according to <6>; and an optical system that guides the exposure light emitted from the light source toward the original plate for exposure, wherein the original plate for exposure is disposed such that the exposure light emitted from the light source passes through the pellicle membrane and is irradiated on the original plate.

<9> The exposure apparatus according to <8>, wherein the exposure light is EUV light.

<10> A method of manufacturing a pellicle, including: a step of preparing a carbon nanotube; a step of preparing a support frame; a step of forming a membrane of the carbon nanotube in a sheet shape to produce a pellicle membrane; and a step of connecting the pellicle membrane to the support frame so as to cover an opening of the support frame having the opening, wherein, in the support frame, a surface in contact with the pellicle membrane of a pellicle to be manufactured has a roughness Ra of 1.0 μm or less, and the support frame has a width of unevenness of 10 μm or less at an edge portion at a surface side in contact with the pellicle membrane and at an inner side of the pellicle to be manufactured.

<11> A method of manufacturing a semiconductor device, including: a step of causing exposure light emitted from a light source to pass through the pellicle membrane of the original plate for exposure according to <6>, irradiating the original plate with the exposure light, and reflecting the exposure light on the original plate; and a step of causing the exposure light reflected by the original plate to pass through the pellicle membrane, and irradiating a sensitive substrate with the exposure light to expose the sensitive substrate in a pattern.

Advantageous Effects of Invention

According to an embodiment of the present disclosure, it is possible to provide a pellicle, an exposure original plate, and an exposure apparatus capable of suppressing damage of a pellicle membrane.

According to another embodiment of the present disclosure, it is possible to provide a method of manufacturing a pellicle and a method of manufacturing a semiconductor device capable of suppressing damage of a pellicle membrane.

DESCRIPTION OF EMBODIMENTS

Figure 1:
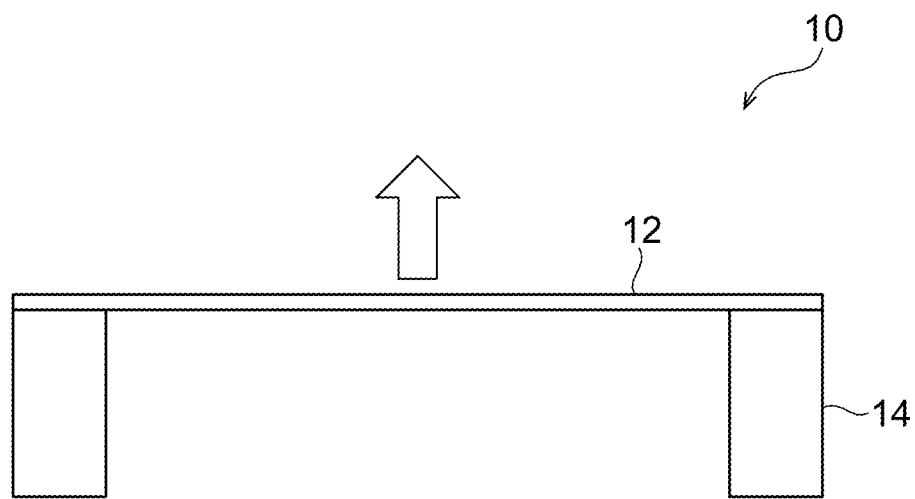
FIG. 1 is a schematic view for explaining a change in pellicle when an inside of an exposure apparatus is changed from an atmospheric pressure state to a vacuum state.
Figure 2:
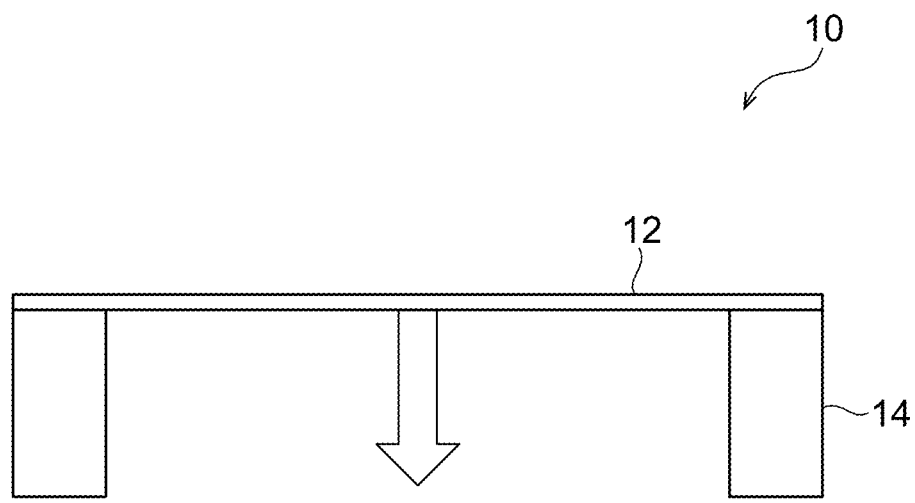
FIG. 2 is a schematic view for explaining the change in pellicle when the inside of the exposure apparatus is changed from the vacuum state to the atmospheric pressure state.
Figure 3A:
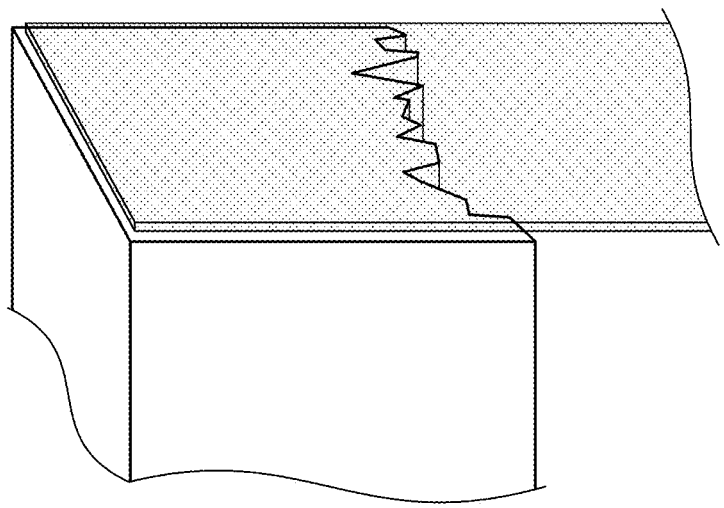
FIG. 3A is a schematic view showing an edge portion on a pellicle inner side of a support frame in the atmospheric pressure state before evacuation is performed.
Figure 3B:
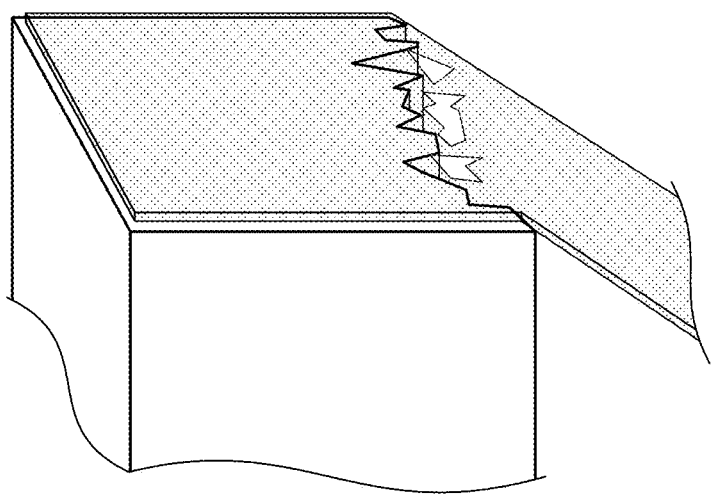
FIG. 3B is a schematic view showing the edge portion on the pellicle inner side of the support frame when exposure is finished and an environment in which the pellicle is placed changes from a vacuum environment to an atmospheric pressure environment.

In the present disclosure, the numerical range expressed using " . . . to . . . " means a range including respective values presented before and after "to" as a minimum value and a maximum value, respectively.

In numerical ranges described in stages in the present disclosure, the upper limit value or the lower limit value of a numerical range of a certain stage may be replaced with the upper limit value or the lower limit value of a numerical range of a different stage. In a numerical range described in the present disclosure, the upper limit value or the lower limit value of a numerical range of a certain stage may be replaced with a value shown in Examples.

In the present disclosure, a combination of two or more preferred aspects is a more preferred aspect.

In the present disclosure, in the case where there are a plurality of substances corresponding to each component, the amount of each component means a total amount of the plurality of substances unless otherwise specified.

In the present specification, the term "process" refers not only to an independent process but also to a process that cannot be clearly distinguished from the other processes, as long as the intended aim of the process is achieved.

<<Pellicle>>

A pellicle of the present disclosure includes:
  a pellicle membrane including at least one selected from the group consisting of a carbon-based membrane having a carbon content of 40% by mass or more, polysilicon, and silicon carbide; and
  a support frame that supports the pellicle membrane,
  in which the pellicle membrane and the support frame are in contact with each other, and at least one of the following conditions 1 and 2 is satisfied.
[Condition 1]
In the support frame, a surface in contact with the pellicle membrane has a roughness Ra of 1.0 μm or less.
[Condition 2]
The support frame has a width of unevenness of 10 μm or less at an edge portion on a surface side in contact with the pellicle membrane and on an inner side of the pellicle.

In the pellicle of the present disclosure, the pellicle membrane preferably includes a carbon-based membrane having a carbon content of 40% by mass or more.

That is, the pellicle of the present disclosure includes the pellicle membrane including the carbon-based membrane having a carbon content of 40% by mass or more and the support frame that supports the pellicle membrane, and it is preferable that the pellicle membrane and the support frame are in contact with each other, and at least one of the following conditions 1 and 2 is satisfied.
[Condition 1]
In the support frame, a surface in contact with the pellicle membrane has a roughness Ra of 1.0 μm or less.
[Condition 2]
The support frame has a width of unevenness of 10 μm or less at an edge portion on a surface side in contact with the pellicle membrane and on an inner side of the pellicle.

With the above configuration, the pellicle of the present disclosure can suppress breakage of the pellicle membrane.

Particularly, in exposure with EUV light, a pellicle using a carbon nanotube (also referred to as CNT) membrane has been studied.

Since a conventional pellicle often has an adhesive layer between the support frame and the pellicle membrane, the adhesive layer prevents direct contact between the pellicle membrane and the support frame, and breakage of the pellicle membrane hardly occurs.

However, the pellicle using a CNT membrane often has a structure in which the support frame and the pellicle membrane are in direct contact with each other. The CNT membrane is softer than a conventional membrane formed of polysilicon, and stress concentration due to deformation is likely to occur.

From the above, in the pellicle using the CNT membrane, the problem of breakage of the pellicle membrane becomes more apparent.

"The pellicle membrane and the support frame are in contact with each other" means a configuration in which at least a part of the pellicle membrane and the support frame is attached without a resin adhesive layer interposed therebetween, and it is preferable that all parts of the pellicle membrane and the support frame are attached without the resin adhesive layer interposed therebetween.

As long as it corresponds to the above configuration, a material for attaching the pellicle membrane and the support frame may be used. For example, the pellicle membrane and/or the support frame may include a layer such as a coating layer.

The material of the coating layer is not particularly limited, may be, for example, an inorganic material, a metal-based material, a semiconductor-based material, or the like, and may include Be, Ru, Ge, Pd, Si, Nb, Zr, Mo, or the like.

From the viewpoint of manufacturing cost and yield, it is preferable that the pellicle membrane and/or the support frame include no coating layer. From the viewpoint of further increasing transmittance, it is preferable that the pellicle membrane is provided with no coating layer.

The pellicle of the present disclosure preferably satisfies both the condition 1 and the condition 2.

Specifically, the pellicle of the present disclosure also preferably satisfies the following aspect.

An embodiment of the pellicle of the present disclosure includes: a pellicle membrane containing a carbon nanotube; and a support frame that supports the pellicle membrane, in which the pellicle membrane and the support frame are in contact with each other, a surface of the support frame (also referred to as the pellicle membrane contact surface), which is in contact with the pellicle membrane, has a roughness Ra of 1.0 μm or less, and the support frame has a width of unevenness of 10 μm or less at an edge portion on a side of the surface in contact with the pellicle membrane and on the inner side of the pellicle.

Figure 4:
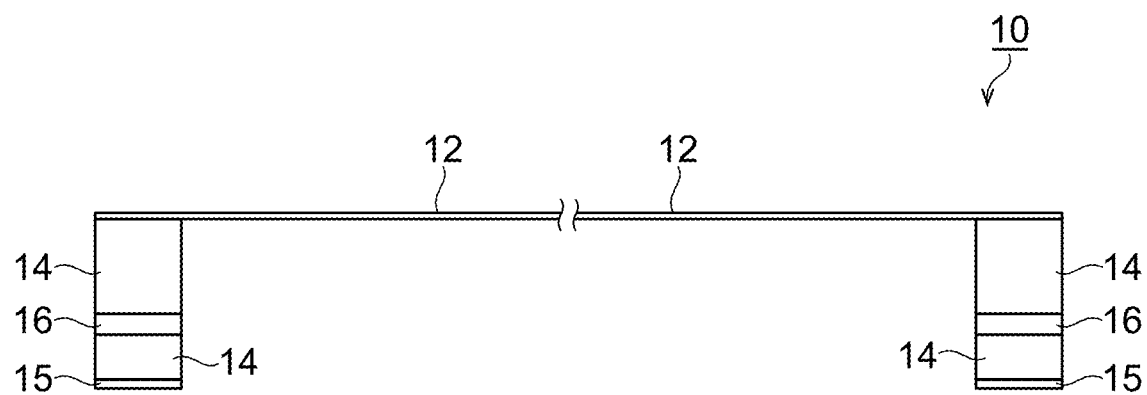
FIG. 4 is a schematic cross-sectional view showing the pellicle of the present disclosure.

Hereinafter, the pellicle of the present disclosure will be described with reference to FIG. 4. FIG. 4 is a schematic cross-sectional view showing the pellicle 10 of the present disclosure. The pellicle 10 is configured by bonding a pellicle membrane 12 and a support frame 14, and a vent hole 16 and an adhesive layer 15 for an original plate are formed at the support frame 14.

<Support Frame>

The pellicle of the present disclosure includes the support frame that supports the pellicle membrane.

Furthermore, the pellicle of the present disclosure satisfies at least one of the following conditions 1 and 2.
[Condition 1]
In the support frame, a surface in contact with the pellicle membrane has a roughness Ra of 1.0 μm or less.
[Condition 2]
The support frame has a width of unevenness of 10 μm or less at an edge portion on a surface side in contact with the pellicle membrane and on an inner side of the pellicle.

As shown in FIG. 4, the support frame (that is, a pellicle frame) 14 is for supporting the pellicle membrane 12.

As shown in FIG. 4, the support frame 14 may have a region surrounded by the pellicle 10 and an original plate (not shown), and the vent hole 16 for making air pressure in an EUV exposure apparatus constant. As described above, even when the vent hole 16 is not provided, if the pellicle membrane of the present disclosure has a nonwoven fabric shape, the membrane itself has air permeability, so that it is possible to create a vacuum environment and a reduced pressure environment.

Since the exposure with the EUV light is performed under the vacuum environment (reduced pressure environment), the pellicle membrane 12 expands and contracts due to a pressure difference at the time of reducing the pressure to vacuum. At this time, the pellicle membrane may be damaged. A filter is preferably disposed in the vent hole 16 so that foreign matter does not enter the region surrounded by the pellicle 10 and the original plate.

Examples of the filter include an ULPA (Ultra Low Penetration Air) filter and a metal mesh. The support frame 14 may be colored within a range that does not interfere with exposure for easy inspection.

The pellicle of the present disclosure satisfies at least one of the conditions 1 and 2.

The pellicle of the present disclosure preferably satisfies both the condition 1 and the condition 2.
[Condition 1]
(Roughness Ra of Support Frame)

In the pellicle of the present disclosure, the pellicle membrane and the support frame are in contact with each other, and in the condition 1, the surface of the support frame in contact with the pellicle membrane has a roughness Ra of 1.0 µm or less.

This makes it possible to suppress breakage of the CNT membrane due to concentration of stress on the surface where the support frame and the pellicle membrane are in contact with each other.

In a case where unevenness in a direction perpendicular to the pellicle membrane contact surface exists in the support frame, when the pellicle membrane is attached to the support frame, the pellicle membrane is stretched by the unevenness. When a curvature of the unevenness is different, a ratio (or stress) at which the pellicle membrane is stretched is different, so that wrinkles and a stress concentration point occur at an edge portion of the unevenness.

Since a higher tension is added to a portion stretched by the uneven portion by a step of performing evacuation in EUV exposure or the like, the pellicle membrane is likely to be damaged.

As the unevenness of the pellicle membrane contact surface is larger (that is, as Ra is larger), an amount of the pellicle membrane to be stretched is larger, and stress is more likely to occur at the uneven portion, so that the pellicle membrane is likely to be damaged.

From the above viewpoint, when the roughness Ra of the pellicle membrane contact surface of the support frame in the present disclosure is 1.0 µm or less, it is possible to suppress the breakage of the CNT membrane due to stress concentration.

In the support frame, the roughness Ra of the pellicle membrane contact surface is preferably 0.8 µm or less, and more preferably 0.5 µm or less, from the viewpoint of suppressing the breakage of the CNT membrane due to stress concentration.

The lower limit of the roughness Ra of the pellicle membrane contact surface of the support frame is not particularly limited, and may be 0.01 µm or more or 0.1 µm or more.

The roughness Ra is measured using a laser microscope in accordance with JIS B 0601 (2001).

Specifically, the roughness Ra is measured by the following method.

<Measurement of Roughness Ra>

The roughness Ra of the pellicle membrane contact surface of the support frame in contact with the pellicle membrane is measured using a laser microscope.

Specifically, using a shape analysis laser microscope (for example, VK-100 of VK series) manufactured by KEYENCE CORPORATION, the magnification of an objective lens is set to 20 times, and the support frame is disposed on a stage such that the pellicle membrane contact surface is perpendicular to incident light.

Figure 5:
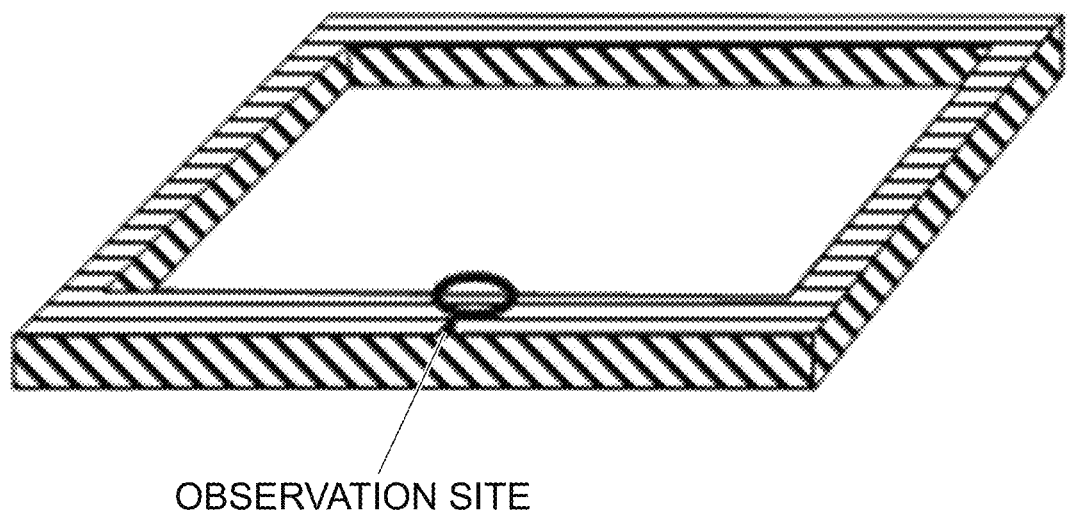
FIG. 5 is a perspective view showing an observation site in measurement of roughness Ra.

FIG. 5 is a perspective view showing an observation site in the measurement of the roughness Ra.

As shown in FIG. 5, the observation site is a central portion of a long side of the support frame. Furthermore, the observation site is installed so as to include an edge portion on an inner side of the support frame (that is, the inner side of the pellicle).

Figure 6:
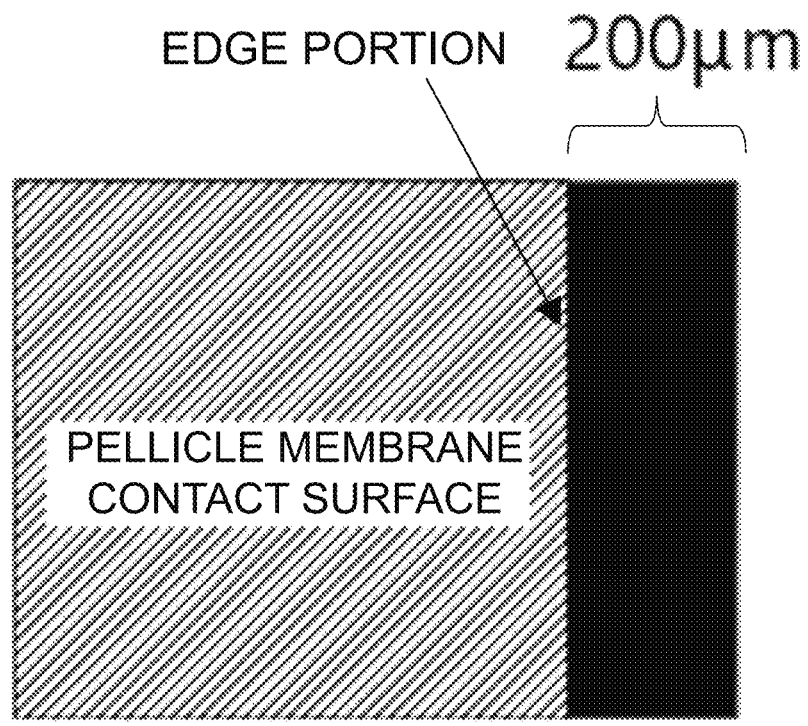
FIG. 6 is a schematic view for explaining a measurement screen in the measurement of the roughness Ra.

FIG. 6 is a schematic view for explaining a measurement screen in the measurement of the roughness Ra.

On the measurement screen, as shown in FIG. 6, a stage position and a sample position are arranged so that the edge portion of the support frame fits in the screen so as to include a space of 200 µm.

A measurement range of height is set by the following procedure.

A mode is switched to a laser observation mode, the upper limit is set to a position higher by 5 µm than a surface of the support frame, and the lower limit is set to a position lower by 30 µm than the position set as the upper limit.

A microscope image including height profile information is obtained with a scan width (that is, pitch and resolution of laser observation) of 0.1 µm.

Figure 7:
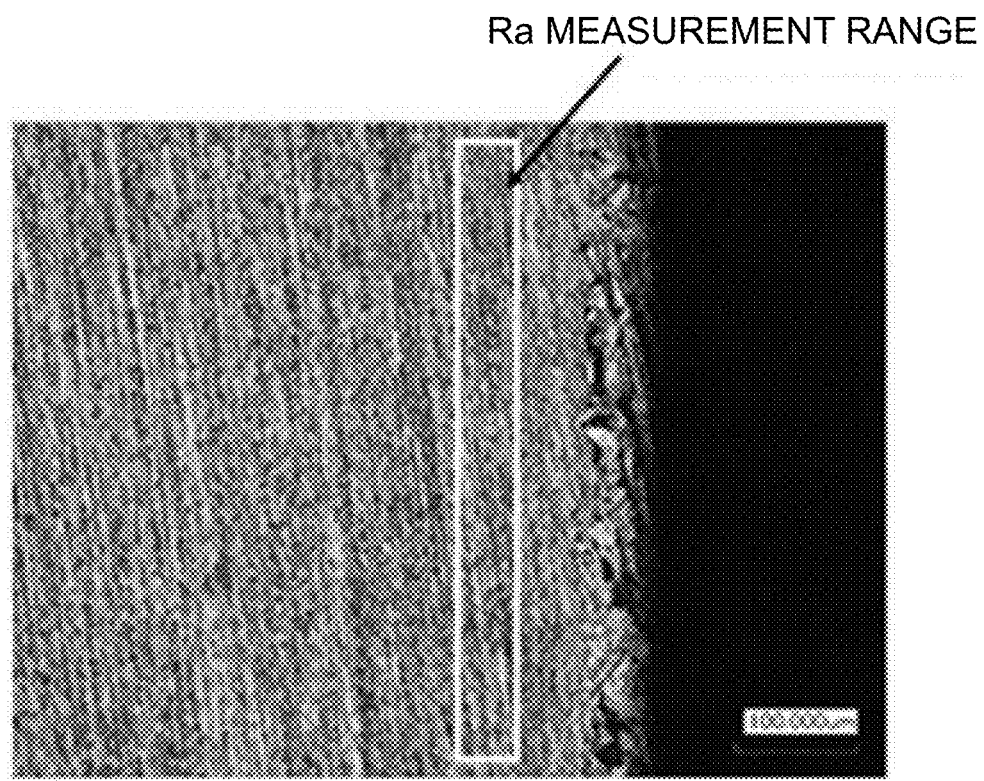
FIG. 7 is a view showing a measurement range in the measurement of the roughness Ra.

FIG. 7 is a view showing a measurement range in the measurement of the roughness Ra.

As shown in FIG. 7, a range parallel to the edge portion of (50 µm in a direction perpendicular to the edge portion)× (500 µm in a direction parallel to the edge portion) is designated as the measurement range at a position about 100 µm away from the edge portion of the support frame, and the roughness Ra is obtained.

A method of setting the roughness Ra of the pellicle membrane contact surface of the support frame to 1.0 µm or less is not particularly limited. Examples of the method include a polishing method of polishing the pellicle membrane contact surface of the support frame and a covering method of covering the pellicle membrane contact surface of the support frame.

[Polishing Method]

As the polishing method, a mechanical polishing method such as buff polishing, belt polishing, a brush method, a steel wool method, a barrel method, a lap polishing method, a grinder polishing, or a CMP polishing method may be used.

In order to more favorably reduce the roughness Ra, the following method is suitable.

—Chemical Polishing Method—

Examples of a method of reducing the roughness Ra include a chemical polishing method.

Examples of the chemical polishing method include an alkali etching method using an aqueous solution of sodium hydroxide and the like, an acidic etching method using a mixed solution of phosphoric acid, nitric acid, and sulfuric acid, a mixed solution of phosphoric acid and nitric acid, a mixed solution of phosphoric acid and sulfuric acid, and the like, and an etching method using a fluorine compound such as hydrogen fluoride or hydrofluoric acid.

For example, as a method of chemical polishing using aluminum, the above-described alkali etching method or acidic etching method can be used.

As a method of chemically polishing glass, the etching method using a fluorine compound such as hydrogen fluoride or hydrofluoric acid can be used.

—Electrolytic Polishing Method—

Examples of a method of reducing the roughness Ra include an electrolytic polishing method.

The electrolytic polishing method is a method in which an object to be polished is connected to an anode side, and a surface is electrochemically polished using carbon and the like on a cathode side.

Examples of an electrolytic solution include a phosphoric acid-sulfuric acid system and an alkali system (for example, anhydrous sodium carbonate-sodium phosphate) when the support frame is aluminum, and a phosphoric acid-sulfuric acid system when the support frame is stainless steel.

[Covering Method]

Examples of the covering method include a method of depositing a deposit having a thickness of about 0.1 µm to 10 µm on the surface of the support frame by plating, coating, a physical or chemical deposition method, or the like.

A membrane is formed by depositing a material to be covered on the surface of the support frame by the deposition method. Then, a deposited layer may be melted by heating the membrane to reduce the roughness Ra of the surface of the support frame.

[Condition 2]
(Unevenness at Edge Portion)

In the condition 2, the support frame in the present disclosure has a width of unevenness of 10 µm or less at the edge portion on the surface side in contact with the pellicle membrane and on the inner side of the pellicle (in the present disclosure, this edge portion is also simply referred to as an edge portion).

This makes it possible to suppress the breakage of the CNT membrane due to concentration of stress on at the edge portion of the support frame.

From the above viewpoint, in the support frame in the present disclosure, the width of the unevenness at the edge portion is preferably 8 µm or less, more preferably 6 µm or less, and still more preferably 4 µm or less.

In the support frame in the present disclosure, the lower limit of the unevenness at the edge portion is not particularly limited, and may be more than 0.1 µm or 1 µm or more.

In the support frame in the present disclosure, the "edge portion on the surface side in contact with the pellicle membrane and on the inner side of the pellicle" means a contour line of a support of the pellicle membrane.

This will be specifically described with reference to FIG. 8.

Figure 8:
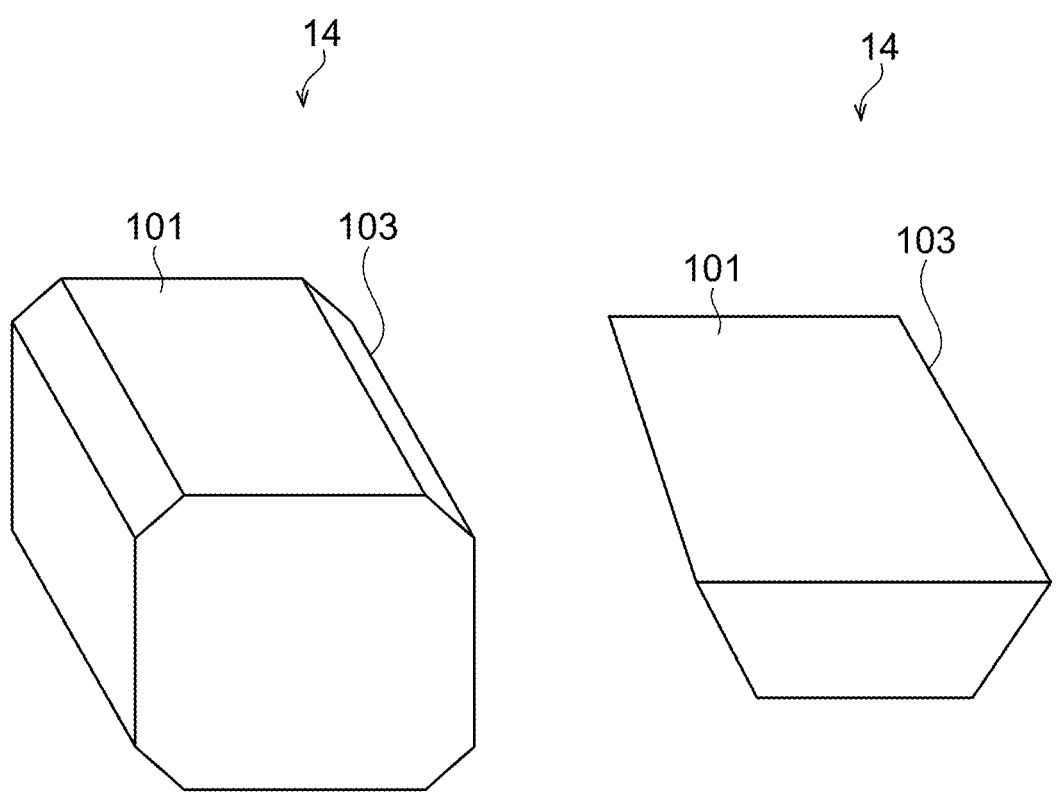
FIG. 8 is a cross-sectional view for explaining a pellicle membrane contact surface and an edge portion of a support frame in the present disclosure.

FIG. 8 is a cross-sectional view for explaining a pellicle membrane contact surface 101 and an edge portion 103 of the support frame 14 in the present disclosure.

The support frame in the present disclosure has the pellicle membrane contact surface 101 in contact with the pellicle membrane. Furthermore, the support frame in the present disclosure has the edge portion 103 on the surface side in contact with the pellicle membrane and on the inner side (that is, a space formed by a periphery of the support frame) of the pellicle in a case where the pellicle is manufactured. The pellicle membrane contact surface 101 and the edge portion 103 are continuous, and the width of the unevenness is 10 µm or less at the edge portion 103.

As described above, the pellicle membrane bulges in a direction from the inside of the pellicle toward the outside of the pellicle by evacuating the exposure apparatus. On the other hand, when the exposure is finished, the pellicle membrane is pushed in a direction from the outside of the pellicle toward the inside of the pellicle.

At this time, stress tends to concentrate on the pellicle membrane, and the pellicle membrane tends to be damaged. In particular, in the pellicle membrane, a portion where the stress is most concentrated is the central portion of the long side of the support frame.

Figure 9:
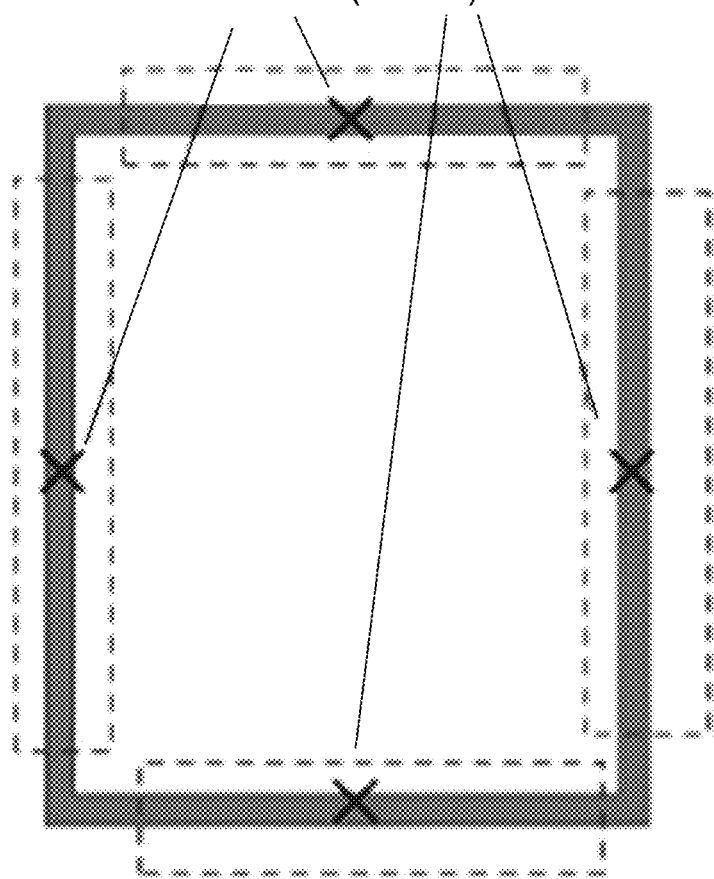
FIG. 9 is a schematic view for explaining "central portions of four long sides of the support frame".

In the present disclosure, as shown in FIG. 9, the width of the unevenness at the edge portion is measured at the central portions of the four long sides in the support frame, and when the width of the unevenness at the edge portion is 10 µm or less at all of the four central portions, it is determined that "the width of the unevenness at the edge portion is 10 µm or less".

<Measurement of Width of Unevenness at Edge Portion>

The width of the unevenness at the edge portion of the support frame in contact with the pellicle membrane is measured using a laser microscope.

Specifically, using the shape analysis laser microscope (VK series and VK-100) manufactured by KEYENCE CORPORATION, the magnification of the objective lens is set to 20 times, and the support frame is disposed on the stage such that the pellicle membrane contact surface is perpendicular to incident light.

The observation site is the central portions of the four long sides in the support frame. Furthermore, the observation site is installed so as to include an edge portion on an inner side of the support frame (that is, the inner side of the pellicle).

Next, a microscopic image including the height profile information is obtained by a method similar to the method described in the measurement of the roughness Ra.

Figure 10:
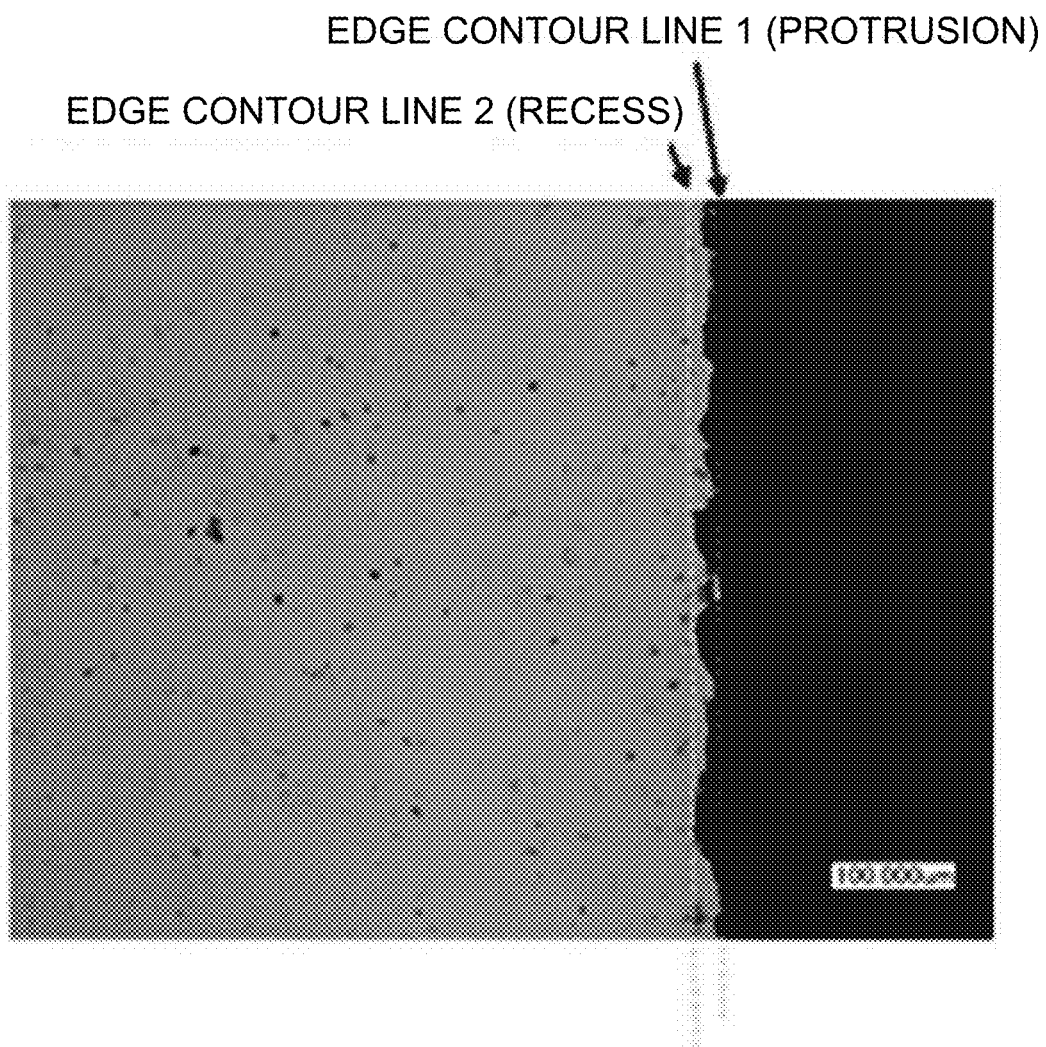
FIG. 10 is a view showing a microscopic image including an edge contour line 1 and an edge contour line 2 used when unevenness at the edge portion is measured.

FIG. 10 is a view showing a microscopic image including an edge contour line 1 and an edge contour line 2 at the edge portion.

As shown in FIG. 10, the contour line of the edge portion is extracted for the obtained microscopic image.

In the microscope image, a line (also referred to as the edge contour line 1) parallel to the edge portion is drawn so as to be in contact with a most protruding portion (that is, protrusion) at the edge portion.

In addition, in the microscopic image, a line (also referred to as the edge contour line 2) horizontal to the edge contour line 1 is drawn so as to be in contact with a portion (that is, recess) recessed to an innermost side at the edge portion.

A difference between the edge contour line 1 and the edge contour line 2 obtained is determined as the width of the unevenness at the edge portion.

For example, in the support frame whose contour line is unclear in the microscopic image, an image of a height profile is displayed, the edge contour line 1 and the edge contour line 2 described above are obtained using a contour line of a portion located about 10 µm below the pellicle membrane contact surface side (uppermost portion), and the width of the unevenness at the edge portion is measured.

A method of setting the width of the unevenness at the edge portion to 10 µm or less is not particularly limited. For example, the above-described polishing method, covering method, or the like may be used.

As a method of polishing the edge portion of the support frame, a bevel polishing method which is often used as a method of polishing an edge portion of a silicon substrate is preferable.

For example, as the bevel polishing method, the method described in Japanese Patent Application Laid-Open (JP-A) No. 2007-005661 can be used.

(Etching)

As the method of setting the width of the unevenness at the edge portion of the support frame to 10 µm or less, it is also preferable to use etching.

The etching method is not particularly limited.

As a method of etching the support frame formed of silicon, for example, anisotropic etching may be used, or isotropic etching may be used, and it is preferable to use anisotropic etching.

As a method of anisotropic etching, for example, anisotropic wet etching using alkali and anisotropic gas etching using deep RIE (Reactive Ion Etching) can be used.

As a chemical solution for anisotropic wet etching using alkali, a tetramethylammonium hydroxide aqueous solution, a potassium hydroxide aqueous solution, or the like can be used.

As a type of gas used for deep RIE, gases such as $C_4H_8$ and $SF_6$ can be used.

An etching mask may be used for etching.

By using the etching mask, it is possible to pattern a portion to be etched. Thus, patterning with high linearity and low roughness can be easily performed.

As a material of the etching mask, for example, SiN, SiO2, SiON, and the like can be used when wet etching with alkali is used, and SiN, photoresist, and the like can be used when deep RIE is used.

After anisotropic etching is performed, isotropic etching using $XeF_2$ gas and the like may be performed for the purpose of removing unevenness.

The material, shape, and the like of the support frame are not particularly limited as long as the support frame is a frame capable of supporting the pellicle membrane of the present disclosure.

The support frame may contain, as a material, a resin such as aluminum, titanium, stainless steel, or a ceramic-based material (for example, silicon, glass, and the like) polyethylene.

Among the above materials, the support frame preferably contains aluminum, titanium, stainless steel, silicon, or glass as a material, and more preferably contains aluminum, titanium, or silicon, from the viewpoint that a content of water is not large and an amount of outgas can be suppressed.

From the viewpoint that the content of water is not large and the amount of outgas can be suppressed, it is preferable that the support frame is subjected to a treatment for making the surface hydrophobic, and it is also preferable that the surface is coated using a material having a small content of water (for example, inorganic materials, ceramic-based materials, and the like).

The support frame may include a first support frame that supports the pellicle membrane and a second support frame connected to the first support frame.

When the support frame includes the first support frame and the second support frame, the first support frame and the second support frame may be bonded with an adhesive layer interposed therebetween.

For example, in the present disclosure, the pellicle including the support frame configured to connect the second support frame to the first support frame may be manufactured in cooperation by a person who manufactures the first support frame that supports the pellicle membrane and a person that connects the second support frame to the first support frame.

The pellicle of the present disclosure also includes a configuration including the pellicle membrane and the first support frame before being connected to the second support frame.

The procedure and method for fixing the pellicle membrane to the support frame are not particularly limited. The etched substrate may be used as a part of the support frame. For example, the pellicle membrane may be stacked on a substrate that can be removed by a specific treatment method, such as a metal, a silicon substrate, glass, a resin, or a salt; thereafter, a mask may be applied to a substrate surface opposite to an arrangement surface of the pellicle membrane in accordance with the size of the frame, and etching or dissolution may be performed while leaving a mask shape. Thereby, the pellicle using a part of the substrate as the support frame can be obtained.

A trimming method for matching the shape of the substrate with the frame shape is not particularly limited. When a silicon substrate is used, a method of mechanically breaking a wafer or a laser trimming method can be used.

<Pellicle Membrane>
(Carbon-Based Membrane)

The pellicle membrane in the present disclosure includes a carbon-based membrane having a carbon content of 40% by mass or more.

When the pellicle membrane contains the carbon-based membrane, the transmittance of EUV light can be increased.

When the carbon-based membrane having a carbon content of 40% by mass or more is connected to the support frame that supports the pellicle membrane, it is not always necessary to use an adhesive. This is because the carbon-based membrane having a carbon content of 40% by mass or more can be connected to the support frame by van der Waals force without interposing the adhesive layer.

From the viewpoint of increasing the transmittance of EUV light, the carbon-based membrane preferably has a carbon content of 50% by mass or more, more preferably has 60% by mass or more, and still more preferably has 80% by mass or more.

The carbon content in the carbon-based membrane is measured by X-ray photoelectron spectroscopy (also referred to as XPS).

Since information obtained by XPS measurement is limited to composition information for a shallow region of several nm from a surface of a thin film, when a carbon-based pellicle membrane having a coating layer on the surface is measured, the composition of the coating layer may be mainly detected.

Thus, when the carbon content in the carbon-based membrane is measured by XPS, composition analysis is performed while etching the pellicle membrane by ion sputtering, and the carbon content is calculated from a total amount of the depth direction profile.

Examples of the carbon-based membrane having a carbon content of 40% by mass or more include a membrane containing a carbon nanotube (in the present disclosure, the carbon nanotube is also simply referred to as "CNT") (in the present disclosure, the membrane is also simply referred to as the "CNT membrane"), a membrane containing graphene, a membrane containing graphite, a membrane containing diamond-like carbon, a membrane containing amorphous carbon, and a membrane containing silicon carbide.

In the pellicle of the present disclosure, the carbon-based membrane is preferably the membrane containing a carbon nanotube (in the present disclosure, the carbon nanotube is also simply referred to as "CNT") (in the present disclosure, the membrane is also simply referred to as the "CNT membrane").

(CNT Membrane)

The CNT membrane is a membrane containing CNT.

When the pellicle membrane contains the CNT, good strength can be obtained.

From the viewpoint of improving light transmittance, a diameter of the CNT tube in the CNT membrane is preferably 0.8 nm or more and 400 nm or less, more preferably 2 nm or more and 100 nm or less, and still more preferably 4 nm or more and 100 nm or less.

The diameter of the tube in the carbon nanotube refers to the diameter of a single fiber when the tube is present as a single fiber in the pellicle membrane, and refers to the diameter of a bundle when the tube is present as a bundle of the CNTs (that is, a bundle) in the pellicle membrane.

The CNT is not particularly limited, and may be a single-walled CNT or a multi-walled CNT.

When the CNT is the single-walled CNT, from the viewpoint of improving the light transmittance, a thickness of the bundle in the single-walled CNT is preferably 4 nm to 400 nm, and more preferably 4 nm to 40 nm.

When the CNT is the multi-walled CNT, from the viewpoint of improving the light transmittance, a thickness of a single fiber in the multi-walled CNT is preferably 4 nm to 400 nm, and more preferably 4 nm to 100 nm.

In the pellicle membrane of the present disclosure, it is preferable that the CNT forms a nonwoven fabric shape.

Since the shape of the CNT contained in the pellicle membrane of the present disclosure is usually a fiber shape, a nonwoven fabric shape can be formed as the entire pellicle membrane of the present disclosure.

Since the CNT contained in the pellicle membrane forms a nonwoven fabric shape, the air permeability of the pellicle membrane can be secured.

For example, when exposure is performed using EUV light by the exposure apparatus including the pellicle, it is required to irradiate the pellicle with EUV light under vacuum or reduced pressure conditions.

Usually, a vent hole is provided in the pellicle, and air inside the pellicle is removed from the vent hole to create a vacuum or depressurized environment; however, there is a problem that it takes time and effort to provide the vent hole.

In the pellicle membrane of the present disclosure, since the CNT forms a nonwoven fabric shape, the air permeability can be secured by the nonwoven fabric shape, and the vacuum or reduced pressure environment can be easily created.

In the pellicle membrane in the present disclosure, a carbon-based membrane and another layer may be stacked.

In the pellicle membrane in the present disclosure, when the carbon-based membrane and another layer are stacked, a thickness of the carbon-based membrane is preferably thicker than a thickness of another layer.

When the carbon-based membrane and another layer are stacked, a layer disposed on an outermost side of the pellicle is preferably another layer.

When the carbon-based membrane and another layer are stacked, the thickness of the carbon-based membrane with respect to the thickness of the entire pellicle membrane including another layer is preferably 50% or more, and more preferably 70% or more.

When the carbon-based membrane and another layer are stacked, the thickness of the carbon-based membrane with respect to the thickness of the entire pellicle membrane including another layer may be 99% or less, and more preferably 90% or less.

The thickness of the carbon-based membrane with respect to the thickness of the entire pellicle membrane including another layer may be 100%. That is, the carbon-based membrane and another layer may not be stacked, and the pellicle membrane of the present disclosure may include only the carbon-based membrane.

Examples of another layer include the following layers.
<Antioxidant Layer>

The pellicle membrane of the present disclosure may further include an antioxidant layer on at least one side.

When the pellicle membrane further includes the antioxidant layer, oxidation of the pellicle membrane can be suppressed during light irradiation or pellicle storage.

The type of the antioxidant layer is not particularly limited as long as the antioxidant layer is a layer made of a material stable to light (preferably EUV light). For example, the antioxidant layer may be a layer made of $SiO_x$ ($x \leq 2$), $Si_xN_y$ (x/y is 0.7 to 1.5), SiON, $Y_2O_3$, YN, Mo, Ru, Rb, Sr, Y, Zr, Nb, or Rh.

In order not to inhibit light transmission, a thickness of the antioxidant layer is preferably about 1 nm to 10 nm, and more preferably about 2 nm to 5 nm. When the thickness of the antioxidant layer is about 1 nm to 10 nm, light absorption by the antioxidant layer can be suppressed, and a decrease in transmittance can be suppressed.

A ratio of the thickness of the antioxidant layer to the thickness of the pellicle membrane is preferably in a range of 0.03 to 1.0. Within the above numerical range, light absorption by the antioxidant layer can be suppressed, and the decrease in transmittance can be suppressed.

When the antioxidant layer is stacked on the pellicle membrane, light is reflected at a newly generated layer interface, that is, an interface between the antioxidant layer and air and an interface between the antioxidant layer and the pellicle membrane, and there is a possibility that the transmittance decreases. A light reflectance at these layer interfaces can be calculated according to the thicknesses of the pellicle membrane and the antioxidant layer and the types of elements constituting the pellicle membrane and the antioxidant layer. By optimizing the thickness of the membrane in the same manner as the principle of an antireflection film, the reflectance can be reduced.

The thickness of the antioxidant layer is preferably an optimum thickness within a range in which a decrease in light transmittance due to absorption and a decrease in light transmittance due to reflection are suppressed, and antioxidation performance is provided.

The thickness uniformity and surface roughness of the antioxidant layer are also not particularly limited. In a patterning step of exposure, the antioxidant layer may be either a continuous layer or a sea-island shaped layer as long as non-uniformity of the thickness or non-uniformity of the transmittance derived from the surface roughness, hindrance due to scattering of light, and the like do not occur, and the thickness may be non-uniform or the surface may have surface roughness.

An average refractive index of the pellicle membrane including the pellicle membrane and the antioxidant layer is preferably in a range of 1.9 to 5.0. The refractive index can be measured by a method such as spectroscopic ellipsometry. An average density of the pellicle membrane including the pellicle membrane and the antioxidant layer is preferably in a range of 1.5 $g/cm^3$ to 5.0 $g/cm^3$. The density can be measured by a method such as an X-ray reflection method.

The thickness of the pellicle membrane (the total thickness when the pellicle membrane includes two or more layers) can be, for example, 10 nm or more and 200 nm or less, and is preferably 10 nm or more and 100 nm or less, more preferably 10 nm or more and 70 nm or less, and still more preferably 10 nm or more and 50 nm or less.

[Physical Properties of Pellicle Membrane]
(Heat Dissipation and Heat Resistance)

When, for example, EUV is used as light for exposure, energy of the EUV is changed to heat through various relaxation processes. Thus, the pellicle membrane is required to have heat dissipation and heat resistance.

The pellicle membrane of the present disclosure can have both the heat dissipation and the heat resistance by containing the CNT, and there is little possibility that the pellicle membrane is damaged during EUV lithography.

Therefore, while a conventional pellicle membrane formed of monocrystalline silicon has a low heat dissipation and has a problem of tending to be deformed or damaged due to thermal damage during EUV light irradiation, the original plate can be reliably protected by using the pellicle membrane of the present disclosure.

Details of the reason why the CNT membrane has both the heat dissipation and the heat resistance are as described in JP-A1-2015/178250.

<Adhesive Layer>

The pellicle of the present disclosure may include an adhesive layer containing an adhesive.

Examples of the aspect of the adhesive layer include the following (a) and (b).
  (a) An adhesive layer (also referred to as an adhesive layer for an original plate) for bonding a support frame and an original plate
  (b) An adhesive layer (also referred to as an adhesive layer for a support frame) for bonding a plurality of support frames to each other in a case where there is a plurality of support frames (Adhesive)

The adhesive contained in the adhesive layer is not particularly limited.

Examples of the adhesive include an acrylic resin adhesive, an epoxy resin adhesive, a polyimide resin adhesive, a silicone resin adhesive, an inorganic adhesive, a double-sided adhesive tape, a polyolefin-based adhesive, and a hydrogenated styrene-based adhesive.

(Application of Pellicle)

The pellicle of the present disclosure may be used not only as a protective member for suppressing adhesion of foreign matter to the original plate in the EUV exposure apparatus, but also as a protective member for protecting the original plate during storage of the original plate or transportation of the original plate. For example, if the pellicle is attached to the original plate (exposure original plate), the pellicle can be stored as it is after being removed from the EUV exposure apparatus. Examples of a method of attaching the pellicle to the original plate include a method of bonding the pellicle with an adhesive, an electrostatic adsorption method, and a method of mechanically fixing the pellicle.

The pellicle of the present disclosure is suitably used for exposure using exposure light having a short wavelength (for example, EUV light, light having a wavelength shorter than that of EUV light, and the like).

Among the above, the pellicle membrane of the present disclosure is suitably used for exposure using EUV light.

In the present disclosure, EUV (Extreme Ultra Violet) light refers to light having a wavelength of 5 nm or more and 30 nm or less.

The wavelength of EUV light is preferably 5 nm or more and 13.5 nm or less.

In the present disclosure, EUV light and light having a wavelength shorter than that of EUV light are collectively referred to as "EUV light or the like" in some cases.

[Modification]

As a modification of the pellicle 20 of the present disclosure, the pellicle membrane forming the pellicle may have an antioxidant layer stacked on both surfaces of the membrane.

When the antioxidant layer is stacked on the pellicle membrane, oxidation of the pellicle membrane is suppressed during EUV light irradiation or pellicle storage. The antioxidant layer may be stacked only on one side of the pellicle membrane.

<<Method of Manufacturing Pellicle>>

A method of manufacturing a pellicle of the present disclosure (hereinafter, the method is also simply referred to as the method of manufacturing a pellicle) includes: a step of preparing a CNT (also referred to as the CNT preparation step); a step of preparing a support frame (also referred to as the support frame preparation step); a step of forming a membrane of the CNT in a sheet shape to produce a pellicle membrane (also referred to as the pellicle membrane production step); and a step of connecting the pellicle membrane to the support frame so as to cover an opening of the support frame having the opening (also referred to as the support frame connection step), in which the support frame has a roughness Ra of a surface in contact with the pellicle membrane of 1.0 μm or less in the pellicle to be manufactured, and the support frame has a width of unevenness of 10 μm or less at an edge portion on a surface side in contact with the pellicle membrane and on an inner side of the pellicle in the pellicle to be manufactured.

<CNT Preparation Step>

The preparation step is a step of preparing the CNT.

The CNT contained in the pellicle of the present disclosure may be commercially available, or may be produced and obtained.

As the CNT, the CNT formed on a chemical vapor deposition substrate by a CVD (Chemical Vapor Deposition) method in which a metal catalyst is present in a reaction system and an oxidizing agent is added to a reaction atmosphere is preferably used.

As the CVD method, for example, a plasma CVD method is used; however, a low-pressure CVD method or a thermal CVD method may be used.

At this time, water vapor is used as the oxidant. The concentration of water vapor may be 10 ppm or more and 10,000 ppm or less, and water vapor may be added under a temperature environment of 600° C. or more and 1000° C. or less.

The CNT may be synthesized by disposing or patterning a metal catalyst on the chemical vapor deposition substrate.

The resulting CNT may be a single layer or a multilayer, or may be CNT erected in a direction perpendicular to a surface of the chemical vapor deposition substrate.

Specifically, the CNT can be manufactured with reference to, for example, WO 2006/011655 A.

Examples of commercially available products of such CNT include CNTs produced by a super growth method sold by Zeon Corporation.

As the CNT (which may be a CNT bulk structure), CNT produced by an enhanced direct injection pyrolytic synthesis method (hereinafter referred to as e-DIPS method) is preferably used.

A direct injection pyrolytic synthesis method (hereinafter referred to as DIPS method) is a gas phase flow method in which a hydrocarbon-based solution containing a catalyst (or a catalyst precursor) and a reaction accelerator is atomized by spraying and introduced into a high-temperature heating furnace to synthesize a single-walled CNT in a flowing gas phase.

The e-DIPS method obtained by improving the DIPS method focuses on a particle formation process in which ferrocene used in a catalyst has a different particle diameter on the upstream and downstream sides in a reaction furnace, and ferrocene is relatively easily decomposed in a carrier gas unlike the DIPS method in which only an organic solvent is used as a carbon source. That is, the e-DIPS method is a method in which a growth point of the single-walled CNT is controlled by mixing a second carbon source that is likely to be a carbon source.

In particular, the CNT can be produced with reference to Saito et al., J. Nanosci. Nanotechnol., 8 (2008) 6153-6157.

Examples of commercially available products of such CNTs include trade name "MEIJOeDIPS" manufactured by Meijo Nano Carbon.

<Pellicle Membrane Production Step>

The pellicle membrane production step is a step of forming a membrane of CNT in a sheet shape to produce a pellicle membrane.

A method of forming a membrane of CNT in a sheet shape is not particularly limited, and for example, a method of forming a membrane of the CNT in a sheet shape on a substrate may be used.

CNT (or CNT bulk structure) obtained by the CVD method, the e-DIPS method, or the like can be used in a state of being dispersed in a solvent.

A liquid (dispersion liquid) in which the CNT (or CNT bulk structure) is dispersed is applied onto the substrate, and the solvent is evaporated and removed to form a CNT membrane on the substrate.

In this case, by removing the solvent used for the dispersion liquid, a membrane in which the CNT is substantially parallel to a surface of a substrate 110 is obtained.

The coating method is not particularly limited, and for example, spin coating, dip coating, bar coating, spray coating, electrospray coating, or the like may be used.

Although the metal catalyst used for forming CNT may cause a decrease in EUV transmittance, when the CNT is peeled off from the chemical vapor deposition substrate, there is no influence because the CNT contains almost no metal catalyst.

As the substrate, an inorganic material may be used.

For example, silicon (Si) may be used for the substrate. The substrate is not limited to silicon (Si), and may be a semiconductor material such as germanium (Ge), silicon germanium (SiGe), silicon carbide (SiC), or gallium arsenide (GaAs), or may be a quartz glass substrate (silicon oxide ($SiO_2$)), a soda glass substrate, a borosilicate glass substrate, a glass substrate such as a sapphire substrate, a silicon nitride (SiN), an aluminum nitride (AlN) substrate, a zirconia ($ZrO_2$) substrate, an aluminum oxide ($Al_2O_3$), or the like.

From the viewpoint of reducing thermal strain with the CNT membrane, the substrate preferably contains at least one of silicon, sapphire, and silicon carbide having a linear thermal expansion coefficient close to that of the pellicle membrane.

The silicon (Si) may be any of single crystal silicon, polycrystalline silicon, microcrystalline silicon, and amorphous silicon, and is preferable from the viewpoint of etching efficiency and the viewpoint of high versatility and low cost of the single crystal silicon.

The shape of the substrate may be circular or rectangular.

The thickness of the substrate is not particularly limited, and is 100 μm or more and 3000 μm or less, and preferably 200 μm or more and 2000 μm or less from the viewpoint of handling.

<Support Frame Preparing Step>

The support frame preparation step is a step of preparing the support frame. In the support frame to be prepared, the roughness Ra of the surface in contact with the pellicle membrane in the pellicle to be manufactured is 1.0 μm or less, and the support frame has a width of unevenness of 10 μm or less at the edge portion on the surface side in contact with the pellicle membrane and on the inner side of the pellicle in the pellicle to be manufactured.

In the support frame, the method of setting the roughness Ra of the surface in contact with the pellicle membrane in the pellicle to be manufactured to 1.0 μm or less is as described above.

In the support frame, the method of setting the width of unevenness to 10 μm or less at the edge portion on the surface side in contact with the pellicle membrane and on the inner side of the pellicle in the pellicle to be manufactured is as described above.

<Support Frame Connection Step>

The support frame connection step is a step of connecting the pellicle membrane to the support frame so as to cover the opening of the support frame having the opening.

In the support frame connection step, after the above-described pellicle membrane and the substrate are separated, the separated pellicle membrane may be connected to the support frame (that is, the pellicle frame).

A method of separating the pellicle membrane and the substrate is not particularly limited, and examples thereof include the following production examples.

(Method of Stacking Sacrificial Layer on Substrate and then Removing Sacrificial Layer)

A sacrificial layer is stacked on a substrate, a pellicle membrane is formed on the sacrificial layer, and the sacrificial layer is then removed later to obtain a free-standing membrane.

The sacrificial layer can be a metal, an oxide film, a resin, a salt, or the like that can be removed by a specific treatment method. For example, the sacrificial layer may be a metal such as aluminum that is soluble in an acidic solution. Specifically, a metal layer is stacked on a surface of a glass substrate or a silicon substrate by vapor deposition, sputtering, or the like, the pellicle membrane is further stacked on the metal layer, and then the membrane is immersed in a solution capable of dissolving the metal layer, such as an acidic solution, whereby the membrane can be peeled off from the substrate.

When a silicon substrate having a natural oxide membrane or a silicon oxide layer is used as the substrate, the pellicle membrane is coated on the natural oxide membrane or the silicon oxide layer on the silicon substrate, and then immersed in a hydrofluoric acid aqueous solution to remove the natural oxide film or the silicon oxide layer, and the pellicle membrane can be peeled off from the substrate.

The sacrificial layer to be stacked on the substrate may be a water-soluble material such as a partially saponified polyvinyl alcohol resin or a salt such as sodium chloride. After the pellicle membrane is stacked on the sacrificial layer, the membrane can be peeled off from the substrate by immersing a laminate in water.

In selecting a method of removing the sacrificial layer stacked on the substrate, a most suitable method can be selected according to characteristics such as process resistance of the pellicle membrane, membrane strength, a removal speed of the sacrificial layer, and the thickness uniformity and surface roughness of the sacrificial layer.

(Method of Etching or Dissolving Substrate)

When materials, such as metal, oxide film, resin and salt, that can be removed by a specific treatment method are used for the substrate, a membrane can be obtained by stacking the pellicle membrane on the substrate, and subsequently etching or dissolving the substrate.

For example, when using copper foil as the substrate, the pellicle membrane is stacked on the surface of the copper foil, and then the resultant laminate is immersed in a cupric chloride etching solution to thereby etch away a copper foil substrate to remove the substrate, whereby a membrane can be obtained.

When using a glass substrate as the substrate, the pellicle membrane is stacked on the glass substrate, and then the glass substrate is etched away using hydrofluoric acid to remove the substrate, whereby a membrane can be obtained.

When using a silicon wafer as the substrate, the pellicle membrane is stacked on the silicon substrate, and then the silicon substrate is etched away by wet etching or dry etching to remove the silicon substrate, whereby a membrane can be obtained.

For the wet etching, an etching solution such as KOH, TMAH or hydrazine can be used. For the dry etching, an etching gas such as a fluorine-based gas ($SF_6$, $CF_4$, $NF_3$, $PF_5$, $BF_3$, $CHF_3$, $XeF_2$, $F_2+NO$), a chlorine-based gas ($Cl_2$, $SiCl_4$), or a bromine-based gas (IBr) can be used. Since the wet etching rate varies depending on the temperature, for etching without causing damage to a membrane containing CNT on the silicon substrate, it is preferable that the liquid temperature is lowered to reduce the etching rate.

For dry-etching the silicon substrate, a layer such as an etching stop layer may be provided in advance on the surface of the silicon substrate.

Examples of the etching stop layer include a layer made of $SiO_2$ or SiN. The etching stop layer is preferably formed of a membrane that generates a tensile stress.

The residual stress applied to the substrate and the surface of the membrane in a parallel direction includes tensile stress and compressive stress. When the force to expand the membrane acts on the inside of the membrane, the force is the tensile stress, and, on the other hand, when a force to contract the membrane acts on the inside of the membrane, the force is the compressive stress. These stresses are mainly imparted during a membrane-forming process of the membrane.

One reason for the residual stress is a difference in the coefficient of thermal expansion between the substrate and the membrane. Although both the substrate and the membrane contract when the temperature is returned to room temperature, the ratio of contraction differs depending on the coefficient of thermal expansion, and when the coefficient of thermal expansion of the membrane is greater than that of the substrate, tensile stress is imparted, and compressive stress is imparted when the relationship is the other way around. The membrane that generates a tensile stress is preferable because tension is applied to the pellicle membrane provided on the membrane to form a membrane without wrinkles. Since the layer made of SiN generates a tensile stress, the pellicle membrane obtained by dry etching the silicon substrate can be a wrinkle-free membrane. The etching stop layer is removed after completion of the dry-etching of the silicon substrate, and thus a desired self-supporting membrane can be obtained.

When using a substrate made of a salt, such as sodium chloride, the pellicle membrane is stacked on the surface of the substrate, and then the resultant laminate is immersed in water to etch away the substrate, and thus to remove the substrate, whereby a membrane can be obtained.

When using a plastic substrate, the pellicle membrane is stacked on the surface of the plastic substrate, and then the resultant plastic substrate is immersed in a solvent capable of dissolving the plastic substrate to dissolve the plastic substrate, whereby a membrane can be obtained.

(Method of Applying Pretreatment to Surface of Substrate for Easy Peeling-Off of the Membrane)

Application of a surface treatment to the substrate enables the control of the interaction between the pellicle membrane and the substrate surface, and enables an easy peeling off of the membrane from the substrate through immersion in a solvent or a mechanical peeling process.

Examples of the method of controlling the interaction between the pellicle membrane and the substrate surface include a surface treatment method using a silane coupling agent. Other methods include a method of washing the substrate surface with water, an organic solvent, piranha solution, sulfuric acid, a UV ozone treatment, or the like.

When using the silicon substrate, a solution used in an RCA washing method, such as a liquid mixture of aqueous hydrogen peroxide and ammonium hydroxide, a liquid mixture of hydrochloric acid and hydrogen peroxide water, or the like can be used.

Formation of the sacrificial layer and the surface treatment of the substrate can be combined with the method of etching or dissolving the substrate. A substance to be used for formation of the sacrificial layer and the surface treatment is preferably a substance which does not easily remain on the surface of or inside the pellicle membrane, or which residues can be removed by an easy method.

Examples of the methods for removing the residues include etching by gas, evaporation by heat, washing with a solvent, and decomposition/removal by light; and a combination thereof.

<Adhesive Layer Forming Step>

The method of manufacturing a pellicle of the present disclosure may further include an adhesive layer forming step.

The adhesive layer forming step is a step of forming an adhesive layer by applying an adhesive to a surface of the support frame at the opening on a side opposite to a side to which the pellicle membrane is connected.

As a result, the original plate such as a photomask and the support frame can be bonded to each other with the adhesive layer interposed therebetween.

A separator may be disposed so as to be in contact with a surface of the formed adhesive layer opposite to the support frame. Thus, the pellicle can be stored while maintaining adhesiveness of the adhesive layer until the original plate and the support frame are bonded with the adhesive layer interposed therebetween.

<Exposure Original Plate>

The exposure original plate of the present disclosure includes an original plate having a pattern, and the pellicle of the present disclosure attached to a surface of the original plate on a side having the pattern.

Since the exposure original plate of the present disclosure includes the pellicle of the present disclosure, the same effect as that of the pellicle of the present disclosure is exhibited.

A method of attaching the original plate to the pellicle of the present disclosure is not particularly limited. For example, the original plate may be adhered directly to the support frame, or via the adhesive layer for the original plate on one end surface of the support frame; alternatively the original plate and the support frame may be fixed utilizing a mechanically fixing method or attraction by a magnet, or the like.

Here, as the original plate, an original plate including a support substrate, a reflection layer stacked on the support substrate, and an absorbent layer formed on the reflection layer can be used. The absorbent layer partially absorbs light (for example, EUV light) to thereby form a desired image on a sensitive substrate (for example, a semiconductor substrate with a photoresist film). The reflection layer may be a multilayer film of molybdenum (Mo) and silicon (Si). The absorbent layer may be a material having high absorbability such as EUV light, such as chrome (Cr) or tantalum nitride.

<Exposure Apparatus>

The exposure apparatus of the present disclosure has the above-described exposure original plate.

More specifically, the exposure apparatus of the present disclosure includes a light source that emits exposure light, the exposure original plate of the present disclosure, and an optical system that guides the exposure light emitted from the light source to the exposure original plate, in which the exposure original plate is disposed such that the exposure light emitted from the light source passes through the pellicle membrane and is irradiated on the original plate.

Thus, the exposure apparatus of the present disclosure has the same effect as that of the exposure original plate of the present disclosure.

The exposure apparatus of the present disclosure includes a light source that emits exposure light, the exposure original plate of the present disclosure, and an optical system that guides the exposure light emitted from the light source to the exposure original plate, and it is preferable that the exposure original plate is disposed such that the exposure light emitted from the light source passes through the pellicle membrane and is irradiated on the original plate.

According to this aspect, it is possible to form a pattern (for example, a line width of 32 nm or less) miniaturized by EUV light or the like, and, in addition, it is possible to perform pattern exposure in which resolution failure due to foreign matter is reduced even in a case of using EUV light in which resolution failure due to foreign matter tends to be a problem.

The exposure light in the present disclosure is preferably EUV light.

<Method of Manufacturing Semiconductor Device>

A method of manufacturing a semiconductor device of the present disclosure, includes: allowing exposure light emitted from a light source to pass through the pellicle membrane of the exposure original plate of the present disclosure, irradiating the original plate with the exposure light, and reflecting the exposure light on the original plate; and allowing the exposure light reflected by the original plate to pass through the pellicle membrane, and irradiating a sensitive substrate with the exposure light to expose the sensitive substrate in a pattern.

According to the method of manufacturing a semiconductor device of the present disclosure, it is possible to manufacture a semiconductor device in which resolution failure due to foreign matter is reduced even in the case of using EUV light in which resolution failure due to foreign matter tends to be a problem.

Hereinafter, an example of the method of manufacturing a semiconductor device according to the present disclosure will be described with reference to FIG. 11.

Figure 11:
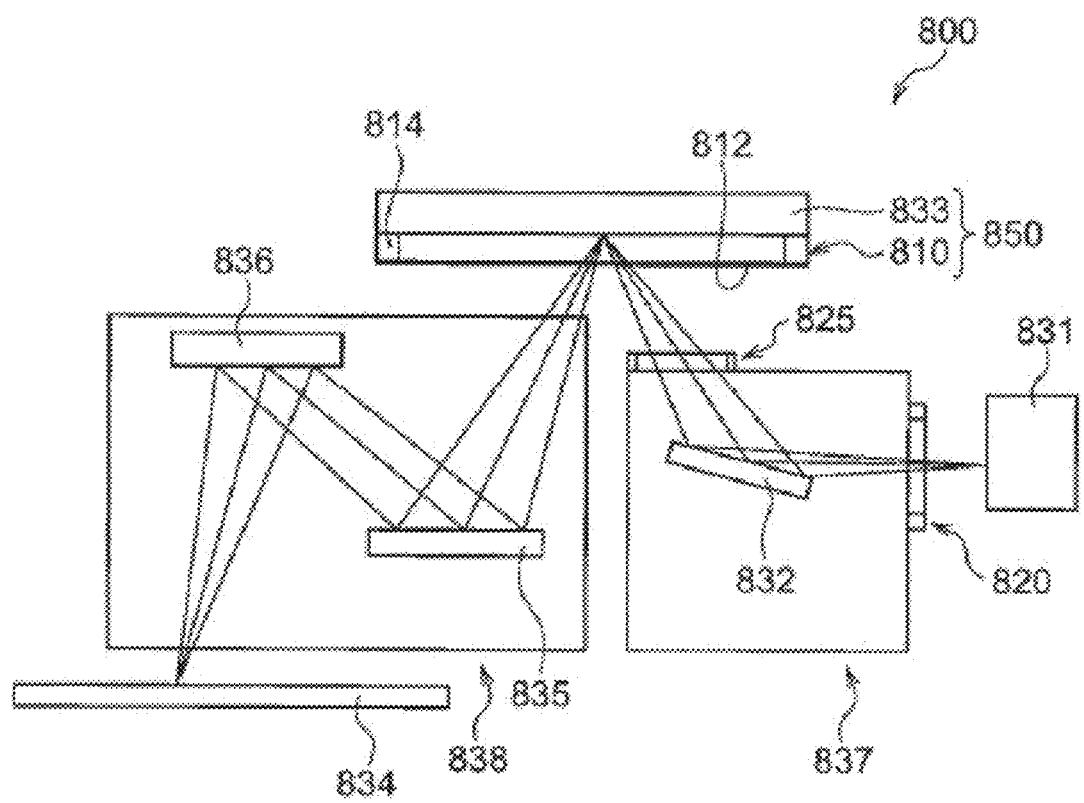
FIG. 11 is a schematic cross-sectional view of an EUV exposure apparatus as an example of the exposure apparatus of the present disclosure.

FIG. 11 is a schematic cross-sectional view of an EUV exposure apparatus 800 as an example of the exposure apparatus of the present disclosure.

As shown in FIG. 11, the EUV exposure apparatus 800 includes a light source 831 that emits EUV light, an exposure original plate 850 that is an example of the exposure original plate of the present disclosure, and an illumination optical system 837 that guides the EUV light emitted from the light source 831 to the exposure original plate 850.

The exposure original plate 850 includes a pellicle 810 including a pellicle membrane 812 and a support frame 814, and an original plate 833. The exposure original plate 850 is disposed such that the EUV light emitted from the light source 831 passes through the pellicle membrane 812 and is irradiated on the original plate 833.

The original plate 833 reflects the applied EUV light in a pattern.

The support frame 814 and the pellicle 810 are examples of the support frame and the pellicle of the present disclosure, respectively.

In the EUV exposure apparatus 800, filter windows 820 and 825 are installed between the light source 831 and the illumination optical system 837 and between the illumination optical system 837 and the original plate 833, respectively.

In addition, the EUV exposure apparatus 800 includes a projection optical system 838 that guides the EUV light reflected by the original plate 833 to a sensitive substrate 834.

In the EUV exposure apparatus 800, the EUV light reflected by the original plate 833 is guided onto the sensitive substrate 834 through the projection optical system 838, and the sensitive substrate 834 is exposed in a pattern. The exposure by EUV is conducted under reduced pressure conditions.

The EUV light source 831 emits EUV light toward the illumination optical system 837.

The EUV light source 831 includes a target material, a pulse laser irradiation part, and the like. A pulse laser is irradiated on the target material to generate plasma, to thereby obtain EUV. When Sn is employed as the target material, EUV having a wavelength of 13 nm to 14 nm is obtained. The wavelength of the light emitted by the EUV light source is not limited to 13 nm to 14 nm, and may be any suitable wavelength selected from the range of from 5 nm to 30 nm.

The illumination optical system 837 condenses light irradiated from the EUV light source 831, equalizes illuminance, and irradiates the light on the original plate 833.

The illumination optical system 837 includes a plurality of multilayer film mirrors 832 for adjusting the optical path of the EUV, an optical coupler (optical integrator), and the like. The multilayer film mirror is, for example, a multilayer film in which molybdenum (Mo) and silicon (Si) are stacked alternately.

The method of attaching filter windows 820 and 825 is not particularly limited, and examples thereof include an adhering method via an adhesive, or the like, and a method in which the filter windows are fixed mechanically inside the EUV exposure apparatus.

The filter window 820 disposed between the light source 831 and the illumination optical system 837 traps scattering particles (debris) generated from the light source to suppress the attachment of the scattering particles (debris) to an element (for example, multilayer film mirror 832) inside the illumination optical system 837

On the other hand, the filter window 825 disposed between the illumination optical system 837 and the original plate 833 traps particles (debris) scattered from the light source 831 side to suppress the attachment of the scattering particles (debris) to the original plate 833.

Foreign matters that attach to the original plate absorb or scatter the EUV light, and thus cause resolution failure on a wafer. Accordingly, the pellicle 810 is attached so as to cover an EUV light irradiation area of the original plate 833. The EUV light passes through the pellicle membrane 812 and is irradiated on the original plate 833.

The EUV light reflected by the original plate 833 passes thorough the pellicle membrane 812 and is irradiated on the sensitive substrate 834 through the projection optical system 838.

The projection optical system 838 condenses the light reflected by the original plate 833 and irradiates the sensitive substrate 834. The projection optical system 838 includes, for example, a plurality of multilayer film mirrors 835 and 836 for adjusting the optical path of the EUV.

The sensitive substrate 834 is, for example, a substrate on which a resist is applied on a semiconductor wafer, and the resist is cured in a pattern by the EUV reflected by the original plate 833. The resist is developed, and the semiconductor wafer is etched, thereby forming a desired pattern on the semiconductor wafer.

The pellicle 810 is attached to the original plate 833 via the adhesive layer for the original plate or the like. Foreign matters that attach to the original plate absorb or scatter the EUV, and thus cause resolution failure on a wafer. Therefore, the pellicle 810 is attached so as to cover the EUV light irradiation area of the original plate 833, and the EUV passes through the pellicle membrane 812 and is irradiated on the original plate 833.

The method of attaching the pellicle 810 to the original plate 833 is not particularly limited as long as the method is capable of providing the pellicle 810 on the original plate in a manner such that foreign matters are prevented from attaching to the surface of the original plate, and examples of such methods include a method in which the support frame 814 and the original plate 833 are bonded with an adhesive, an electrostatic adsorption method, and a mechanically fixing method, although the method is not particularly limited. Preferably, the bonding method with an adhesive is used.

EXAMPLES

Hereinafter, the present disclosure will be described in more detail with reference to examples and the like, but the invention of the present disclosure is not limited only to these examples.

In this example, the roughness Ra of the pellicle membrane contact surface and the width of the unevenness at the edge portion were measured by the above-described method.

First, a support frame used in each Example or Comparative Example was produced as follows.

Example 1

—Tetramethylammonium Oxide (TMAH) Anisotropic Etching—

An SiN layer was deposited on both surfaces of a silicon substrate having a thickness of 725 μm, and a 1 cm pattern using the SiN layer as an etching mask was formed on one surface side.

Si was etched by immersing the silicon substrate in an aqueous solution of 25% by mass tetraethylammonium hydroxide heated to 80° C. After the etching, the SiN layer on the surface was removed to obtain a support frame made of silicon.

For the obtained support frame, the roughness Ra of the pellicle membrane contact surface and the width of the unevenness at the edge portion were measured. The results are shown in Table 1.

Example 2

—Bosch Anisotropic Etching—

A photoresist was applied to a mirror surface side of a single-side polished silicon substrate having a thickness of 525 μm, and a 1 cm pattern was drawn on the photoresist.

A through hole of 1 cm was formed in the silicon substrate by a deep RIE process, and then the photoresist was removed to obtain a support frame made of silicon in which one surface was a mirror surface and the other surface was a rough surface.

For the obtained support frame, the roughness Ra of the pellicle membrane contact surface and the width of the unevenness at the edge portion were measured. The results are shown in Table 1.

Example 3

—Mechanical Polishing and Chemical Polishing by Phosphoric Acid, Nitric Acid and Sulfuric Acid Treatment—

A support frame made of aluminum was obtained by chemically polishing the aluminum support frame having a hole of 1 cm formed by cutting and having a thickness of 2 mm using a phosphoric acid-nitric acid-sulfuric acid mixed solution.

For the obtained support frame, the roughness Ra of the pellicle membrane contact surface and the width of the unevenness at the edge portion were measured. The results are shown in Table 1.

Example 4

—Belt Polishing—

A hole of 1 cm was formed by cutting a glass plate having a thickness of 2 mm, and then an edge portion was processed by belt polishing to obtain a glass support frame.

For the obtained support frame, the roughness Ra of the pellicle membrane contact surface and the width of the unevenness at the edge portion were measured. The results are shown in Table 1.

Example 5

—Blasting Treatment—

A hole of 1 cm was formed by cutting an aluminum support frame having unevenness formed on the surface by blast treatment and having a thickness of 2 mm, and then an edge portion was processed by belt polishing to obtain a support frame made of aluminum.

For the obtained support frame, the roughness Ra of the pellicle membrane contact surface and the width of the unevenness at the edge portion were measured. The results are shown in Table 1.

Comparative Example 1

—Blasting Treatment—

A support frame made of aluminum was obtained by forming unevenness on the pellicle membrane contact surface and an edge portion of an aluminum support frame having a hole of 1 cm formed by cutting and having a thickness of 2 mm by blast treatment.

For the obtained support frame, the roughness Ra of the pellicle membrane contact surface and the width of the unevenness at the edge portion were measured. The results are shown in Table 1.

Comparative Example 2

—Grinder Polishing—

A hole of 1 cm was formed in a stainless steel (SUS 304) plate having a thickness of 2 mm by cutting, and then a diamond grindstone was attached to a tip end portion of a rotating shaft of a grinder to polish an edge portion, thereby obtaining a glass support frame.

For the obtained support frame, the roughness Ra of the pellicle membrane contact surface and the width of the unevenness at the edge portion were measured. The results are shown in Table 1.

Comparative Example 3

—Mechanical Polishing—

Mechanical polishing was performed by polishing a surface and an edge portion of a silicon support frame having a hole of 1 cm formed using a nanosecond pulse laser and having a thickness of 525 μm using a diamond grindstone to obtain a support frame made of silicon. The results are shown in Table 1.

<Manufacture of Pellicle>

A pellicle was manufactured as follows using the support frame obtained in each Example or Comparative Example.

(Preparation of CNT)

As a raw material of the CNT membrane, a single-walled CNT (Crude CNT, manufactured by Meijo Nano Carbon, trade name: EC 1.5-P, tube diameter: 1 nm to 3 nm, tube length: 100 nm or more) synthesized by the enhanced direct injection pyrolytic synthesis method (eDIPS method) was prepared.

(Production of CNT Membrane)

70 mL of isopropyl alcohol and 30 mL of ethanol were added to 30 mg of the single-walled CNT synthesized by the enhanced direct injection pyrolytic synthesis method (eDIPS method), 30 mg of polyacrylic acid was further added as an additive, and the mixture was stirred at 40° C. for 18 hours using a magnetic stirrer to obtain a suspension.

The obtained suspension was subjected to ultrasonic dispersion at an output of 40% for a total of 2 hours using a probe type ultrasonic homogenizer. At this time, ice cooling was performed every 20 minutes for 5 minutes. After ultrasonic dispersion, defoaming treatment was performed to obtain a dispersion liquid (crude CNT dispersion liquid) containing crude CNT.

The obtained crude CNT dispersion liquid was centrifuged using a high-speed centrifuge (himac trade name: CS 100 GX) under conditions of an average relative centrifugal force of 150,000×g, 120 minutes, and 10° C. After centrifugation, a supernatant was removed to obtain a dispersion liquid (purified CNT dispersion liquid) containing purified CNT. The purified CNT dispersion liquid was spin-coated on a silicon substrate having a size of 8 inches at a rotation speed of 1500 rpm (revolutions per minute) to obtain a CNT membrane on the silicon substrate.

In the measurement of the thickness of the CNT membrane, the thickness of the CNT membrane obtained by immersing the obtained membrane on a water surface, peeling off the membrane, and transferring onto a silicon substrate was measured using a microspectroscopic film thickness meter (OPTM manufactured by Otsuka Electronics Co., Ltd., model: A-1). The thickness of the CNT membrane was 15 nm±0.2 nm.

(Manufacture of Pellicle)

The silicon substrate was permeated into water so that the CNT membrane floated on a liquid surface of water, and the CNT membrane was scooped so as to cover the opening of the support frame using the support frame obtained in each Example and Comparative Example, whereby a pellicle including a pellicle membrane and the support frame was manufactured.

<Evaluation>

The pellicle obtained in each Example and Comparative Example was evaluated as follows.

(Evaluation of Fracture by Bulge Test)

For the pellicle obtained in each Example and Comparative Example, fracture evaluation of the pellicle membrane by a bulge test was performed as follows.

Figure 12:
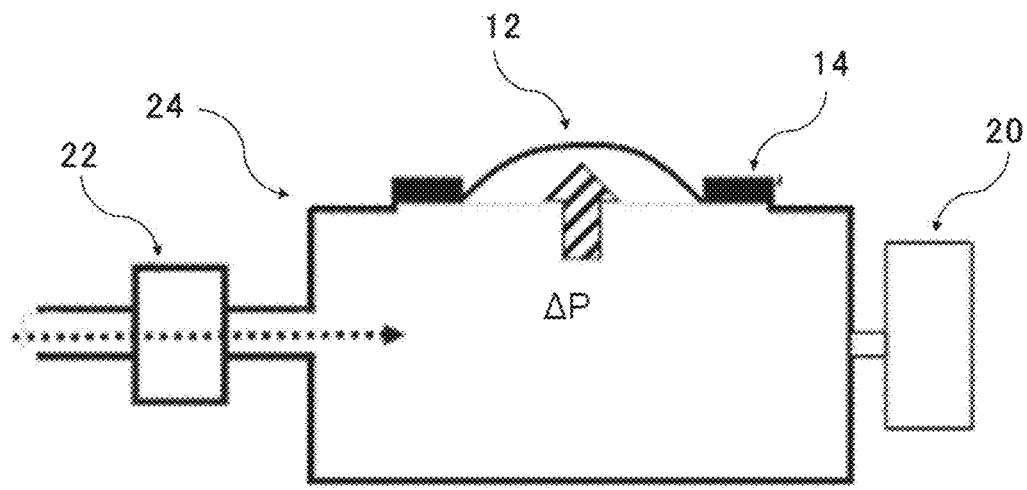
FIG. 12 is a schematic diagram showing a measurement device in a bulge test.

As shown in FIG. 12, the pellicle including the pellicle membrane 12 and the support frame 14 was fixed to a chamber 24 having a volume of 4.6 L (diameter 240 mm, height 100 mm). At this time, the pellicle membrane 12 was disposed on the inner side of the chamber 24.

Air was caused to flow into the chamber 24 at an acceleration of 5 sccm/sec using the flow meter 22 to pressurize the inside of the chamber 24. The pressure applied to the pellicle membrane was measured using a Baratron differential pressure gauge 20. As a flow rate of the chamber 24 increased, a differential pressure and swelling of the pellicle membrane increased, and the flow rate and the differential pressure were measured when the pellicle membrane was broken. A point (that is, timing) at which the pellicle membrane was broken was measured with a camera.

The results are shown in Table 1.

In this bulge test, while the pellicle membrane is not broken during pressurization and maintains its shape, the membrane swells due to an elastic behavior of the membrane. On the other hand, pressurization and deformation of the pellicle membrane due to pressurization cause fracture of the pellicle membrane. As a result, a gas is released from a fracture point of the pellicle membrane, the swelling of the pellicle membrane is eliminated, and the fracture of the pellicle membrane is observed.

TABLE 1

| | Material | Roughness Ra of pellicle membrane contact surface [μm] | Unevenness at edge portion [μm] | Differential pressure at pellicle membrane fracture time [Pa] |
|---|---|---|---|---|
| Example 1 | Silicon | 0.4 | 3 | 185 |
| Example 2 | Silicon | 0.9 | 3 | 147 |
| Example 3 | Aluminum | 0.4 | 7 | 121 |
| Example 4 | Glass | 0.5 | 14 | 78 |
| Example 5 | Aluminum | 1.2 | 9 | 82 |
| Comparative Example 1 | Aluminum | 1.2 | 17 | 49 |
| Comparative Example 2 | Stainless steel | 1.1 | 14 | 56 |
| Comparative Example 3 | Silicon | 1.2 | 19 | 38 |

In Table 1, "Width of unevenness at edge portion" means the difference between the edge contour line 1 and the edge contour line 2 at the edge portion.

As shown in Table 1, in the example using the pellicle including the pellicle membrane including a carbon-based membrane having a carbon content of 40% by mass or more and the support frame that supported the pellicle membrane, in which the pellicle membrane and the support frame were in contact with each other, and at least one of the conditions 1 and 2 was satisfied, since the differential pressure at the time when the pellicle membrane was fractured was high, the breakage of the pellicle could be satisfactorily suppressed.

On the other hand, in Comparative Examples 1 to 3 using the pellicle in which the roughness Ra of the pellicle membrane contact surface was more than 1.0 μm and the width of the unevenness at the edge portion was more than 10 μm in the support frame, the differential pressure at the time when the pellicle membrane was fractured was remarkably low, and therefore the breakage of the pellicle could not be suppressed.

Among Examples, in Examples 1 to 3 in which the pellicle satisfying both the condition 1 and the condition 2 was used, the differential pressure at the time when the pellicle membrane was fractured was remarkably high, and therefore the breakage of the pellicle could be more favorably suppressed.

The disclosure of Japanese Patent Application No. 2020-133262, filed on Aug. 5, 2020, is incorporated herein by reference in its entirety.

All publications, patent applications, and technical standards mentioned in this description are incorporated herein by reference to the same extent as if each individual publication, patent application, or technical standard was specifically and individually indicated to be incorporated by reference.

The invention claimed is:

1. A pellicle comprising:
   a pellicle membrane including at least one selected from the group consisting of a carbon-based membrane having a carbon content of 40% by mass or more, polysilicon, and silicon carbide; and
   a support frame that supports the pellicle membrane,
   wherein the pellicle membrane and the support frame are in contact with each other, and the following condition A is satisfied:
   condition A: the support frame has a width of unevenness of 10 μm or less at an edge portion at a surface side in contact with the pellicle membrane and at an inner side of the pellicle.

2. The pellicle according to claim 1, wherein the pellicle membrane includes a carbon-based membrane having a carbon content of 40% by mass or more.

3. The pellicle according to claim 1, wherein the carbon-based membrane is a membrane containing a carbon nanotube.

4. The pellicle according to claim 1, wherein the following condition B is further satisfied:
   condition B: in the support frame, a surface in contact with the pellicle membrane has a roughness Ra of 1.0 μm or less.

5. The pellicle according to claim 1, wherein the support frame includes a first support frame that supports the pellicle membrane and a second support frame connected to the first support frame.

6. An original plate for exposure comprising:
   an original plate having a pattern; and
   the pellicle according to claim 1 mounted on a surface of the original plate on a side having the pattern.

7. An exposure apparatus comprising the original plate for exposure according to claim 6.

8. An exposure apparatus comprising:
   a light source that emits exposure light;
   the original plate for exposure according to claim 6; and
   an optical system that guides the exposure light emitted from the light source toward the original plate for exposure,
   wherein the original plate for exposure is disposed such that the exposure light emitted from the light source passes through the pellicle membrane and is irradiated on the original plate.

9. The exposure apparatus according to claim 8, wherein the exposure light is EUV light.

10. A method of manufacturing a semiconductor device, comprising:
    a step of causing exposure light emitted from a light source to pass through the pellicle membrane of the original plate for exposure according to claim 6, irradiating the original plate with the exposure light, and reflecting the exposure light on the original plate; and
    a step of causing the exposure light reflected by the original plate to pass through the pellicle membrane, and irradiating a sensitive substrate with the exposure light to expose the sensitive substrate in a pattern.

* * * * *